(12) United States Patent
Morgan et al.

(10) Patent No.: US 6,365,946 B1
(45) Date of Patent: *Apr. 2, 2002

(54) INTEGRATED-CIRCUIT ISOLATION STRUCTURE AND METHOD FOR FORMING THE SAME

(75) Inventors: G. Eric Morgan, Preoria; Eric Vandenbossche, Phoenix; Piyush M. Singhal, Scottsdale, all of AZ (US)

(73) Assignee: STMicroelectronics, Inc., Carrollton, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/311,339

(22) Filed: May 13, 1999

(51) Int. Cl.[7] .......................... H01L 29/76; H01L 29/94; H01L 31/062; H01L 31/119
(52) U.S. Cl. ........................................ 257/397; 257/396
(58) Field of Search .................... 257/374, 394, 257/395, 396, 397

(56) References Cited

U.S. PATENT DOCUMENTS

| | | | | |
|---|---|---|---|---|
| 4,578,128 A | * | 3/1986 | Mundt et al. | |
| 5,306,940 A | * | 4/1994 | Yamazaki | 257/371 |
| 5,362,981 A | * | 11/1994 | Sato et al. | 257/371 |
| 5,585,659 A | * | 12/1996 | Kobayashi et al. | 257/371 |
| 5,777,370 A | * | 7/1998 | Omid-Zohoor et al. | 257/374 |
| 5,969,393 A | * | 10/1999 | Noguchi | 257/396 |
| 6,005,279 A | * | 12/1999 | Luning | 257/510 |
| 6,114,741 A | * | 9/2000 | Joyner et al. | 257/506 |

* cited by examiner

*Primary Examiner*—Ngân V. Ngô
(74) *Attorney, Agent, or Firm*—Lisa K. Jorgenson; Bryan A. Santarelli

(57) ABSTRACT

An IC isolation structure includes a recess disposed in a conductive layer having a surface portion. The recess has a side wall adjacent to the surface portion, and the isolation structure also includes an insulator disposed in the recess and overlapping the surface portion. Thus, if a transistor is disposed in the conductive layer adjacent to the recess side wall, the overlapping portion of the insulator increases the distance between the upper recess corner and the gate electrode. This increased distance reduces hump effects to tolerable levels.

24 Claims, 6 Drawing Sheets

US 6,365,946 B1

INTEGRATED-CIRCUIT ISOLATION STRUCTURE AND METHOD FOR FORMING THE SAME

TECHNICAL FIELD

The invention relates generally to integrated circuits (ICs), and more particularly to an improved isolation structure and a method for forming the same. For example, the isolation structure reduces "hump" effects in transistors that are adjacent to the structure, particularly in transistors having a feature size of 0.25 microns ($\mu$m) or less.

BACKGROUND OF THE INVENTION

To meet the industry demand for ICs that pack greater functionality into the same or a smaller die area, IC manufacturers continue to research and develop processes that allow integrated devices such as transistors to have smaller geometries. For example, a few years ago, many IC manufacturers used a 4 $\mu$m process, which can form devices having a feature size (e.g., the width of a transistor gate) as small as 4 $\mu$m. But today, 1 $\mu$m processes are common, and 0.25 $\mu$m, 0.18 $\mu$m and 0.1 $\mu$m processes are under development. These smaller-geometry processes allow the formation of integrated devices having smaller geometries. Consequently, such processes allow more devices—and thus more functionality—on a given die area than larger-geometry processes do.

Unfortunately, merely scaling down the dimensions of an integrated device to take advantage of a smaller-geometry process may render the device inoperable. For example, due to known short-channel effects, a transistor having a gate width of 4 $\mu$m may operate improperly if it is scaled down to have a gate width of 1 $\mu$m.

FIG. 1 is a cross-sectional view of a conventional silicon-trench isolation (STI) structure 10, which is part of an IC 11 such as a memory circuit. The IC 11 includes transistors 12a and 12b, which are disposed in a substrate 13 having a surface 14 and corners 16a and 16b. The transistors 12a and 12b include respective body regions 18a and 18b, which are disposed in the substrate 13 and which electrically invert during transistor operation to form respective channel regions. Gate insulators 20a and 20b are respectively disposed on the body regions 16a and 16b. A conductor 22, such as a word line, extends over the isolation structure 10 and the gate insulators 20a and 20b and acts as a gate electrode for both the transistors 12a and 12b.

Unfortunately, the isolation structure 10 may cause the transistors 12a and 12b to operate improperly. The isolation structure 10 includes an isolation trench 24 disposed in the substrate 13. The trench 24 is filled with an insulator 26 having side walls that often taper inwardly as they extend from the trench 24 above the surface 14 of the substrate 13. This narrowing forms gaps 28a and 28b, which allow the gate conductor 20 to closely overlap the corners 16a and 16b, respectively. During operation of the transistors 12a and 12b, this overlap often causes undesirable fringe, i.e., "hump," effects in the respective regions of the transistors' electric fields near the corners 16a and 16b. If the transistors 12a and 12b have relatively large feature sizes, then these hump effects typically have only a negligible affect on transistor operation. But if the transistors 12a and 12b have relatively small feature sizes, particularly feature sizes of 0.25 $\mu$m or less, then these hump effects may severely degrade the transistor operation, and may even render the transistors 12a and 12b unusable. Furthermore, even if the side walls of the insulator 26 are straight outside of the trench 24, the conductor 22 may still be close enough to the corners 16a and 16b to cause significant hump effects.

SUMMARY OF THE INVENTION

In one aspect of the invention, an IC isolation structure includes a recess disposed in a conductive layer having a surface portion. The recess has a side wall adjacent to the surface portion, and the isolation structure also includes an insulator disposed in the recess and overlapping the surface portion.

Thus, if a transistor is disposed in the conductive layer adjacent to the recess side wall, the overlapping portion of the insulator increases the distance between the recess corner and the gate electrode. This increased distance reduces hump effects to tolerable levels.

DETAILED DESCRIPTION OF THE INVENTION

Figure 1:
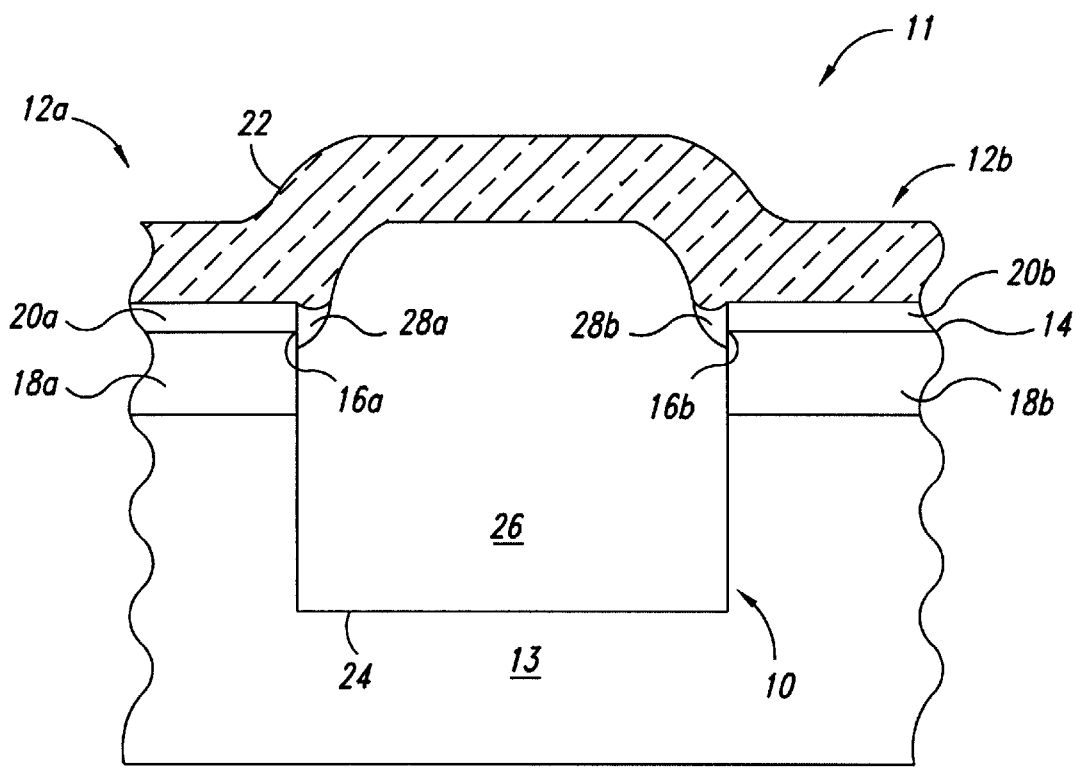
FIG. 1 is a cross-sectional view of a conventional IC isolation structure.
Figure 2:
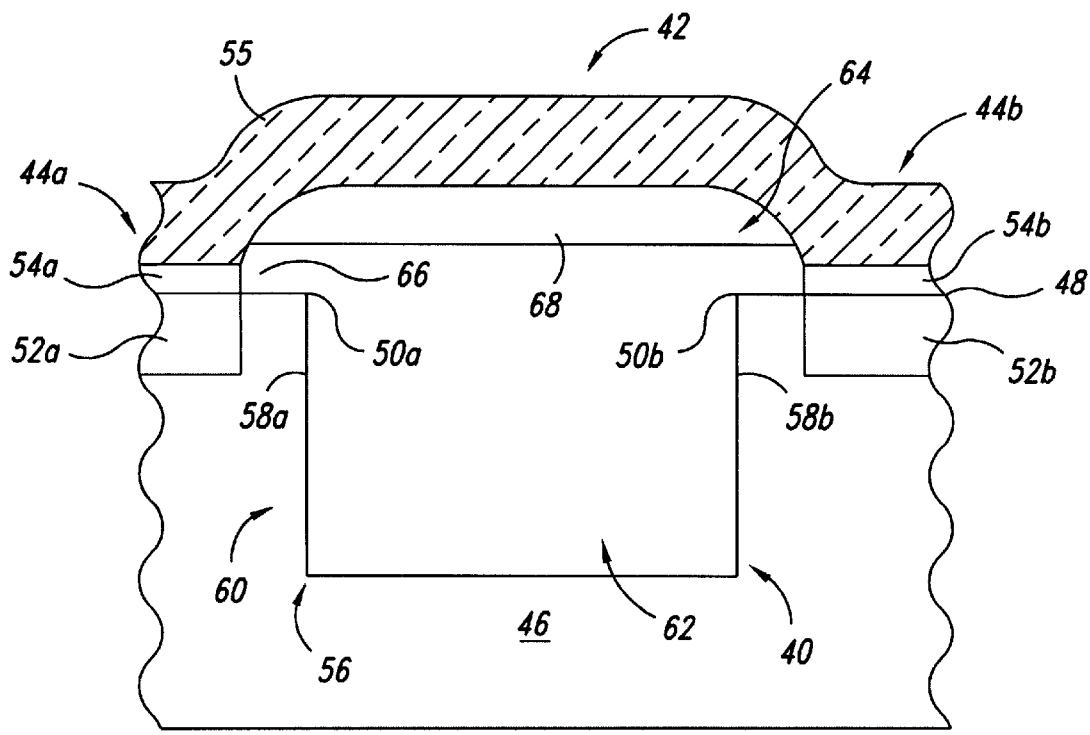
FIG. 2 is a cross-sectional view of an IC isolation structure according to an embodiment of the invention.

FIG. 2 is a cross-sectional view of an IC isolation structure 40 according to an embodiment of the invention. The isolation structure 40 is part of an IC 42, which in one embodiment is similar to the IC 11 of FIG. 1. The IC 42 includes transistors 44a and 44b, which are disposed in a conductive layer 46 having a surface 48 and corners 50a and 50b. In one embodiment, the layer 46 is a semiconductor substrate. The transistors 44a and 44b include respective body regions 52a and 52b, which are disposed in the layer 46. Gate insulators 54a and 54b are respectively disposed on the body regions 52a and 52b, and a conductor 55 such as a word line extends over the isolation structure 40 and the gate insulators 54a and 54b and acts as a gate electrode for both the transistors 44a and 44b. Although shown laterally spaced from the corners 50a and 50b, in another embodiment the body regions 52a and 52b extend to the respective corners.

The isolation structure 40 reduces or eliminates hump effects in the transistors 44a and 44b by increasing the distance and decreasing the overlap between the gate electrode 55 and the corners 50a and 50b. Specifically, the isolation structure 40 includes an isolation recess 56 disposed in the layer 46 and having side walls 58a and 58b. In the illustrated embodiment, the recess 56 is a trench. A mushroom-shaped trench insulator 60 is disposed in the trench 56 and includes an inner portion, i.e., "stem," 62 and an outer portion, i.e., "cap," 64. In one embodiment, the insulator 60 includes two insulator layers 66 and 68, although it may include a single layer or three or more layers in other embodiments. The cap 64 is wider than the stem 62, and thus laterally extends beyond the side walls 58a and 58b to overlap the corners 50a and 50b and the adjacent portions of the conductive-layer surface 48. But although described as overlapping both corners 50a and 50b, in another embodiment the cap 64 overlaps only one of the corners. The overlapping portions of the cap 64 increase the respective distances between the gate electrode 55 and the corners 50a and 50b. These increased distances reduce the electrical fields between the electrode 55 and the corners 50a and 50b, and thus reduce the hump effects caused by the electrode 55 during operation of the transistors 44a and 44b. Therefore, the isolation structure 40 is particularly advantageous for use in 0.25 μm or smaller processes.

Figure 3:
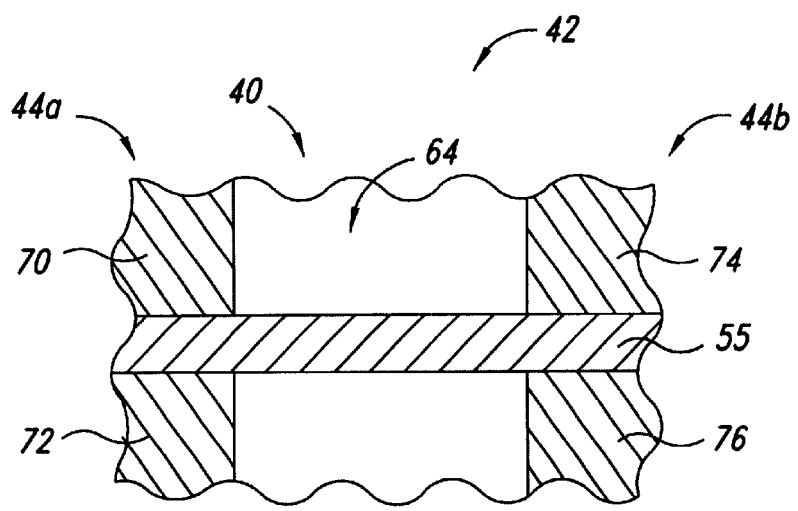
FIG. 3 is a top view of the IC isolation structure of FIG. 2.

FIG. 3 is a top view of the isolation structure 40 and the surrounding portions of the IC 42 of FIG. 2. The transistor 44a includes source/drain regions 70 and 72, and the transistor 44b includes source/drain regions 74 and 76. Although not shown, the transistors 44a and 44b may be bounded on one or more of their other sides by isolation structures that are similar to the structure 40.

FIGS. 4–10 show steps of a process for forming the IC isolation structure 40 of FIGS. 2 and 3 according to an embodiment of the invention.

Figure 4:
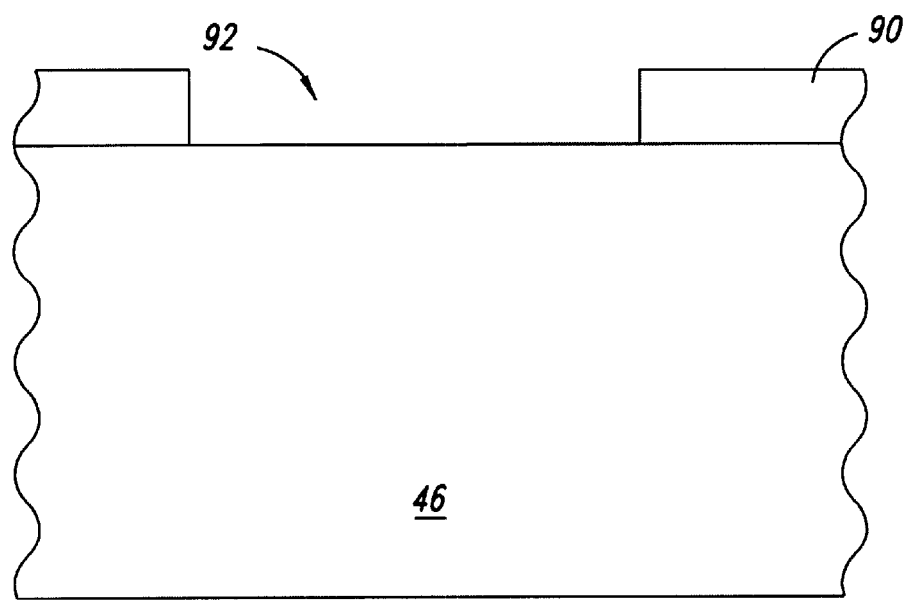
FIG. 4 is a cross-sectional view of a semiconductor structure at a point in a process for forming the isolation structure of FIGS. 2 and 3 according to an embodiment of the invention.

Referring to FIG. 4, a mask layer 90 is conventionally formed on the conductive layer 46, and an opening 92 is conventionally formed in the mask layer 90 to expose a portion of the layer 46. In one embodiment, the layer 46 is a semiconductor substrate such as a silicon substrate, the mask layer 90 is a nitride layer, and the opening 92 has a width approximately equal to the minimum feature size of the process.

Figure 5:
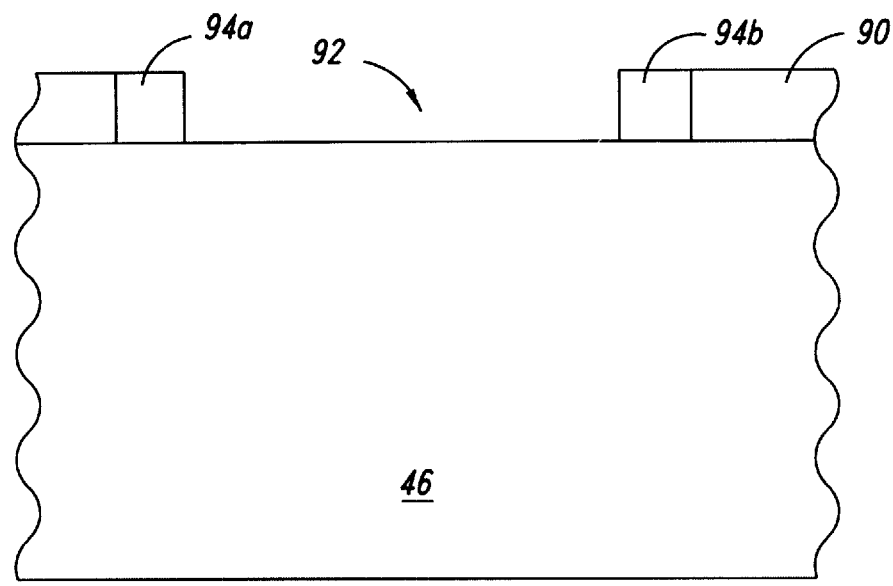
FIG. 5 is a cross-sectional view of the semiconductor structure of FIG. 4 at a subsequent point in the process.

Referring to FIG. 5, spacers 94a and 94b are conventionally formed on the side walls of the opening 92 to narrow the width thereof. In one embodiment, the spacers 94a and 94b are formed from tetraethylorthosilicate (TEOS) and each have a width of approximately 300–400 Angstroms (Å).

Figure 6:
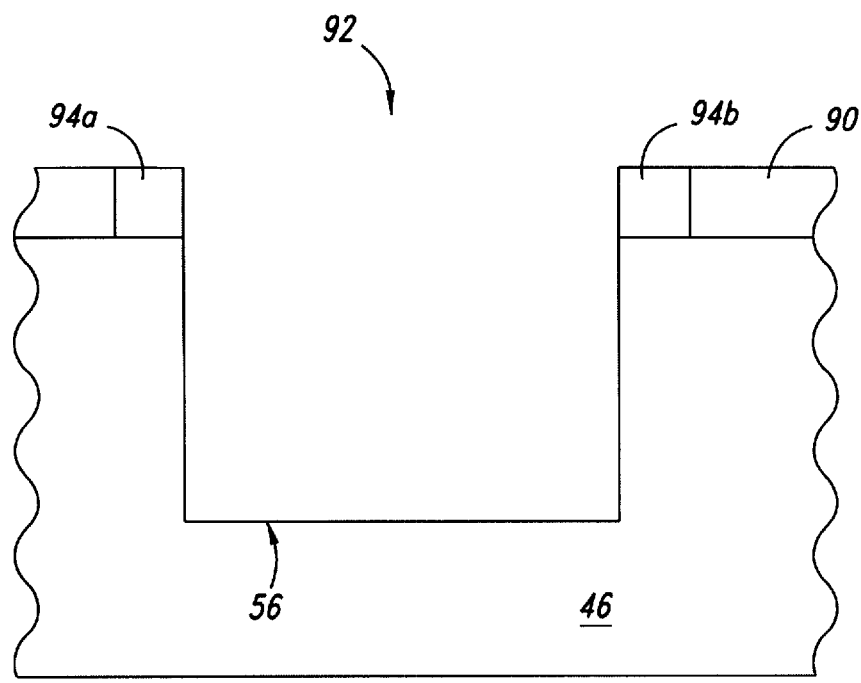
FIG. 6 is a cross-sectional view of the semiconductor structure of FIG. 5 at a subsequent point in the process.

Referring to FIG. 6, the conductive layer 46 is conventionally etched through the narrowed opening 92 to form the trench 56. In one embodiment, the conductive layer 46 is anisotropically etched to a depth of approximately 0.2–0.4 μm to form the trench 56.

Figure 7:
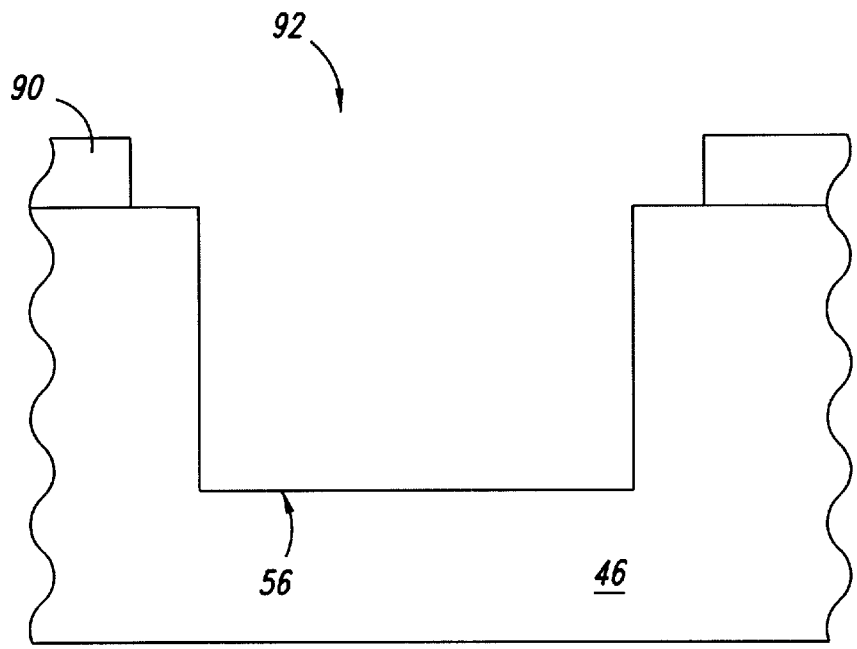
FIG. 7 is a cross-sectional view of the semiconductor structure of FIG. 6 at a subsequent point in the process.

Referring to FIG. 7, the spacers 94a and 94b are conventionally removed.

Figure 8:
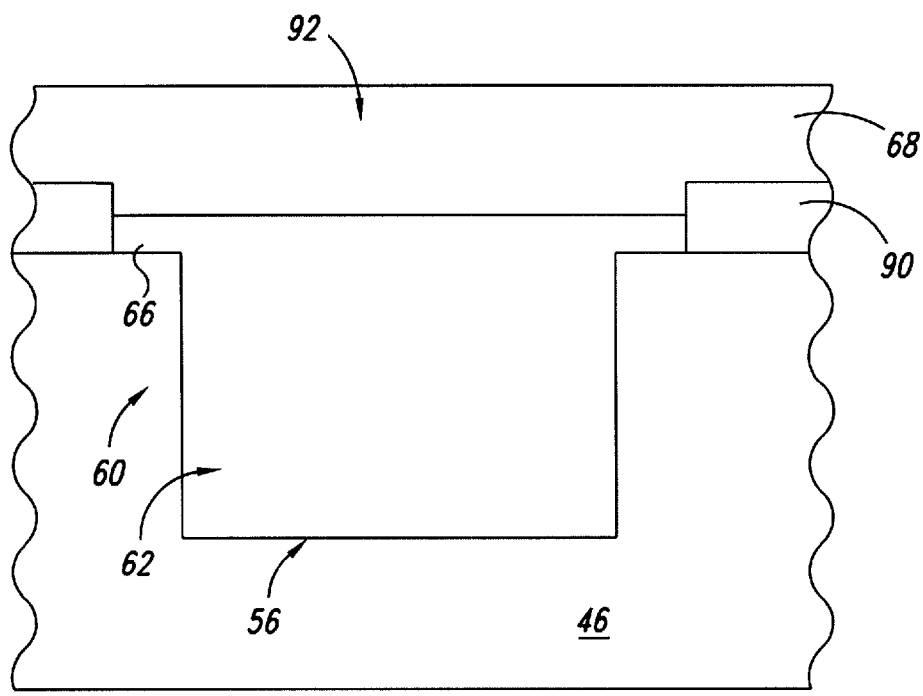
FIG. 8 is a cross-sectional view of the semiconductor structure of FIG. 7 at a subsequent point in the process.

Referring to FIG. 8, the trench 56 is conventionally filled with the first insulator layer 66 to form the stem 62 of the trench insulator 60. In one embodiment, the layer 66 is an oxide that completely fills the trench 56 and the opening 92 such that the trench insulator 60 is formed from a single layer. In the illustrated embodiment, however, the first layer 66 partially fills the opening 92 and the second insulator layer 68 is conventionally formed on the layer 66. In one embodiment, the second layer 68 is TEOS. In yet another embodiment, the trench insulator 60 may include more than two layers.

Figure 9:
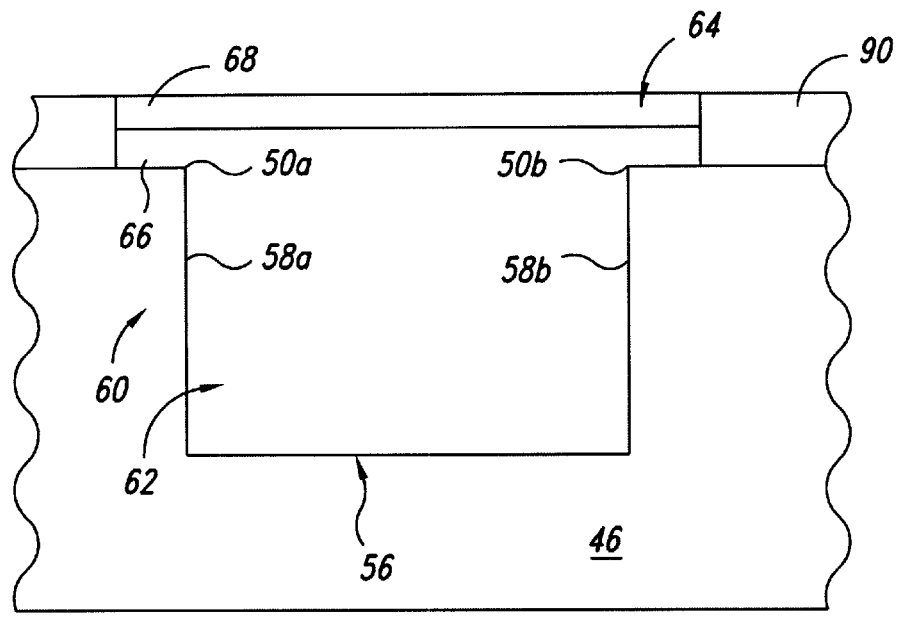
FIG. 9 is a cross-sectional view of the semiconductor structure of FIG. 8 at a subsequent point in the process.

Referring to FIG. 9, the insulator 60 is conventionally polished back to the mask layer 90, which acts as a polish stop. In the illustrated embodiment, the layer 68 is polished back to the layer 90.

Still referring to FIG. 9, because the cap 64 fills the voids left by the spacers 94a and 94b (FIGS. 5–6), in one embodiment it overlaps the corners 50a and 50b by approximately 300–400 Å with respect to the side walls 58a and 58b and is approximately 300–400 Å high with respect to the surface 48. The cap overlap distances and height can be different, however, depending upon the process.

Figure 10:
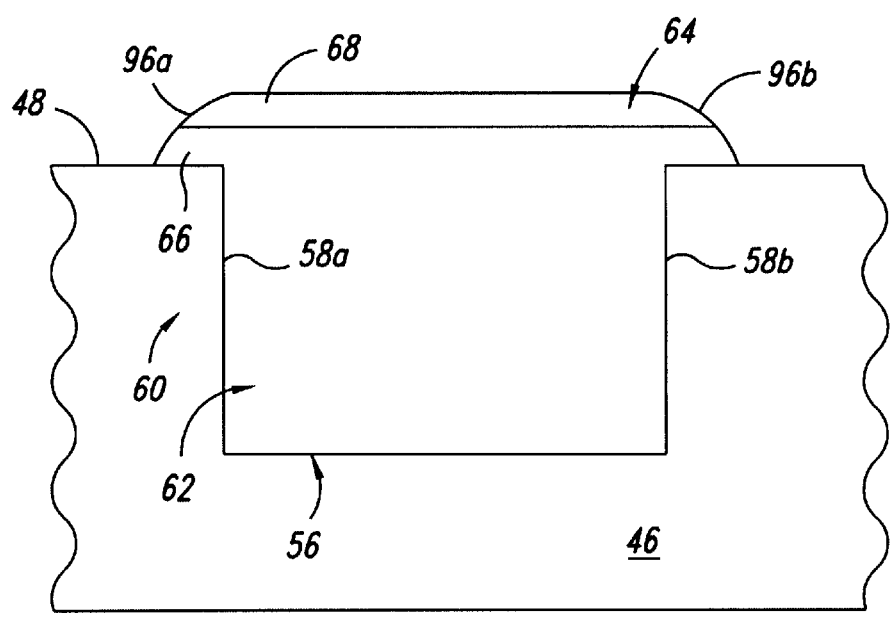
FIG. 10 is a cross-sectional view of the semiconductor structure of FIG. 9 at a subsequent point in the process.

Referring to FIG. 10, the mask layer 90 is conventionally removed. In one embodiment, the step of removing the layer 90 also rounds the upper corners 96a and 96b of the cap 64. Thus, the trench insulator 60 "mushrooms" laterally beyond the trench side walls 58a and 58b and overlaps adjacent regions of the surface 48 of the conductive layer 46. In another embodiment, however, the corners 96a and 96b are not rounded.

Referring again to FIGS. 2 and 3, the body regions 52a and 52b, conductor 55, gate insulators 54a and 54b, and source/drain regions 70, 72, 74, and 76 are conventionally formed.

Figure 11:
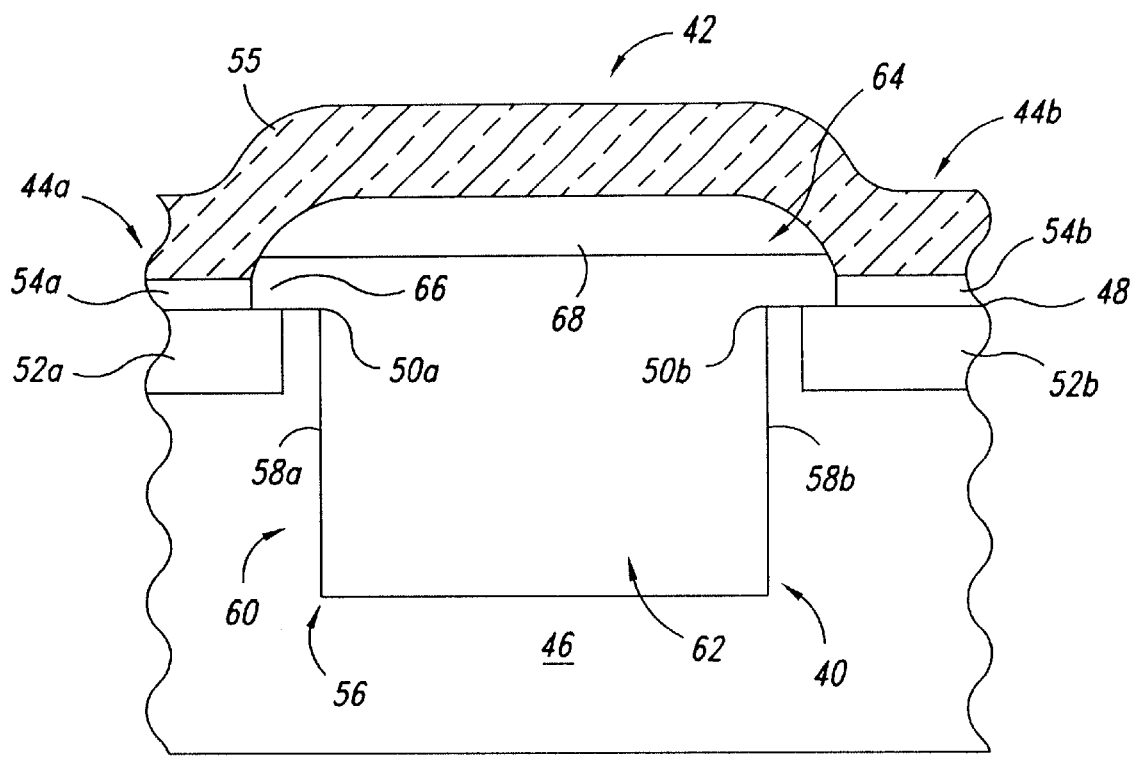
FIG. 11 is a cross-sectional view of an IC isolation structure according to another embodiment of the invention.
Figure 12:
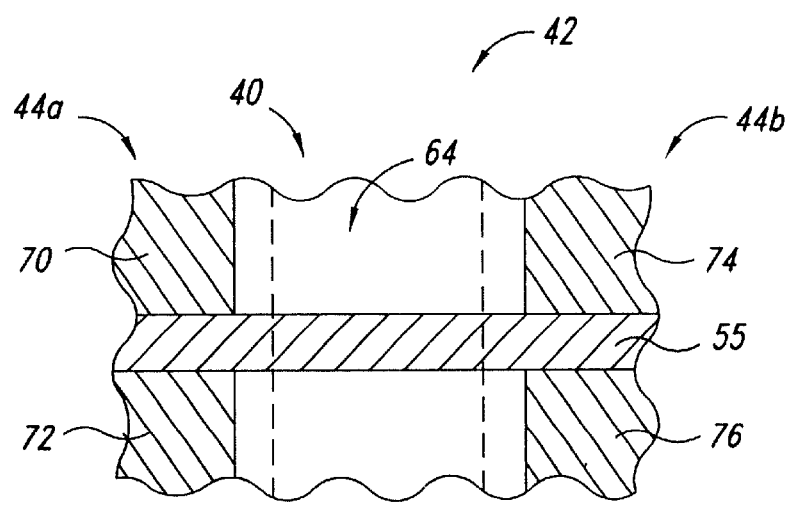
FIG. 12 is a top view of the IC isolation structure of FIG. 11.

The isolation structure 42 of FIGS. 11 and 12 is similar to the isolation structure 42 of FIGS. 2 and 3 except that the body regions 52a and 52b and the source/drain regions 70, 72, 74, and 76 extend beneath the cap 64.

From the foregoing it will be appreciated that, although specific embodiments of the invention have been described herein for purposes of illustration, various modifications may be made without deviating from the spirit and scope of the invention. For example, instead of being disposed in the trench 56, the insulator 60 can be disposed in a recess having more than two side walls, with the cap 64 overlapping at least one of the side walls.

From the foregoing it will be appreciated that, although specific embodiments of the invention have been described herein for purposes of illustration, various modifications may be made without deviating from the spirit and scope of the invention.

What is claimed:

1. A semiconductor structure, comprising:
    a conductive layer having an upper surface;
    a recess disposed in the conductive layer and having a side wall, a planar portion of the upper surface of the conductive layer extending a first distance from the side wall;
    an insulator disposed in the recess and laterally overlapping the side wall by a second distance that is less than or equal to the first distance; and
    a transistor channel region disposed in the conductive layer and contiguous with the insulator, the transistor channel region having an end portion spaced from the side wall of the recess by third distance that is greater than zero and less than or equal to the second distance.

2. The structure of claim 1 wherein the conductive layer comprises a semiconductor substrate.

3. The structure of claim 1 wherein the insulator comprises multiple layers.

4. A semiconductor structure, comprising:
    an isolation trench disposed in a conductive layer having an upper surface with a first planar portion, the trench having a first trench side wall adjacent to the first planar portion;
    an insulator disposed in the trench and laterally extending out of the trench beyond the first trench side wall, the insulator having a first insulator side that is disposed over the first planar portion of the upper surface of the conductive layer; and a transistor channel region disposed in the conductor layer contiguous with the first insulator side and spaced from the first trench side wall.

5. The structure of claim 4 wherein:

the upper surface of the conductive layer has a second planar portion;

the isolation trench has a second trench side wall opposite the first trench side wall and adjacent to the second planar portion of the upper surface of the conductive layer; and the insulator laterally extends out of the trench beyond the second trench side wall, the insulator having a second insulator side that is disposed over the second planar portion of the upper surface of the conductive layer.

6. A semiconductor structure, comprising:

a conductive layer having an upper surface with first and second planar surface portions;

an isolation trench disposed in the conductive layer, the trench having first and second opposite side walls that are respectively adjacent to the first and second planar surface portions;

an insulator having an inner portion disposed in the trench and having an outer portion disposed outside of the trench, the outer portion laterally extending beyond the first and second side walls and having first and second ends that are respectively disposed over the first and second planar surface portions; and first and second transistor channel regions disposed in the conductive layer adjacent to and spaced from the first and second trench side walls, respectively, and contiguous with the outer portion of the insulator.

7. The structure of claim 6 wherein the insulator comprises an oxide.

8. The structure of claim 6 wherein the insulator comprises tetraethylorthosilicate.

9. The structure of claim 6 wherein the outer portion of the insulator comprises multiple layers of insulating material.

10. A semiconductor structure, comprising:

a semiconductor substrate having an upper surface with first and second planar regions;

an isolation trench disposed in the substrate and having first and second opposite side walls that are respectively contiguous with the first and second planar regions;

an insulator having a stem portion disposed in the trench and having a cap portion disposed on the stem portion, the cap portion having first and second edges that are respectively disposed on the first and second planar regions; and a first transistor channel region disposed in the substrate, contiguous with one of the first and second edges of the cap portion, and spaced from a corresponding one of the first and second side walls.

11. The structure of claim 10 wherein:

the stem portion of the insulator comprises a first insulator material; and the cap portion of the insulator comprises the first insulator material.

12. The structure of claim 10 wherein:

the stem portion of the insulator comprises a first insulator material; and the cap portion of the insulator comprises:
the first insulator material; and
a second insulator material disposed on the first insulator material.

13. A semiconductor structure, comprising:

a semiconductor substrate having an upper surface with first and second planar regions;

an isolation trench disposed in the substrate and having first and second opposite side walls respectively adjacent to the first and second planar regions;

a first transistor channel disposed in the first planar region of the upper surface of the substrate and spaced from the first side wall of the isolation trench;

a first insulator having an inner portion disposed in the trench and having an outer portion that overlaps respective portions of the first and second planar regions and that is contiguous with the first transistor channel;

a second insulator disposed on the first transistor channel and contiguous with the outer portion of the first insulator; and a conductor disposed on the first and second insulators.

14. An integrated circuit, comprising:

a substrate having a surface;

an isolation trench disposed in the substrate and having first and second opposite side walls;

an isolation insulator disposed in the trench and having an outer portion that extends beyond the first side wall over the substrate surface, the outer portion having a first end laterally spaced from the first side wall and having a bottom that faces the substrate, extends between the first side wall and the first end, and is planar in a direction perpendicular to the first side wall;

a first body region disposed in the substrate adjacent to and laterally spaced from the first side wall and having first and second sides;

a first source/drain region disposed in the substrate adjacent to and laterally spaced from the first side wall of the trench and adjacent to the first side of the first body region;

a second source/drain region disposed in the substrate adjacent to and laterally spaced from the first side wall of the trench and adjacent to the second side of the first body region;

a first gate insulator disposed on the first body region; and a first gate electrode disposed on the isolation and first gate insulators.

15. The integrated circuit of claim 14 wherein the first body region, the first source/drain region, and the second source/drain region have respective portions disposed beneath the outer portion of the isolation insulator.

16. The integrated circuit of claim 14 wherein the first body region, the first source/drain region, and the second source/drain region are laterally spaced from the first side wall of the isolation trench.

17. The integrated circuit of claim 14, further comprising:

a second body region disposed in the substrate adjacent to the second side wall of the isolation trench and having first and second sides;

a third source/drain region disposed in the substrate adjacent to the second side wall of the trench and to the first side of the second body region;

a fourth source/drain region disposed in the substrate adjacent to the second side wall of the trench and to the second side of the second body region;

a second gate insulator disposed on the second body region;

wherein the first gate electrode is disposed on the second gate insulator; and wherein the outer portion of the isolation insulator extends beyond the second side wall over the substrate surface, the outer portion having a second end laterally spaced from the second side wall and having a bottom that faces the substrate, extends between the second side wall and the second end, and is planar in a direction perpendicular to the second side wall.

18. The integrated circuit of claim 14, further comprising:

a second body region disposed in the substrate adjacent to the second side wall of the isolation trench and having first and second sides;

a third source/drain region disposed in the substrate adjacent to the second side wall of the trench and to the first side of the second body region;

a fourth source/drain region disposed in the substrate adjacent to the second side wall of the trench and to the second side of the second body region;

a second gate insulator disposed on the second body region;

a second gate electrode disposed on the isolation and second gate insulators; and wherein the outer portion of the isolation insulator extends beyond the second side wall over the substrate surface, the outer portion having a second end laterally spaced from the second side wall and having a bottom that faces the substrate, extends between the second side wall and the second end, and is planar in a direction perpendicular to the second side wall.

19. The integrated circuit of claim 14 wherein a portion of the substrate surface disposed beneath the outer portion of the isolation insulator is coplanar with a portion of the substrate surface disposed in the first body region.

20. The semiconductor structure of claim 1 wherein the planar portion of the upper surface of the conductive layer is contiguous with the side wall of the recess.

21. The semiconductor structure of claim 4 wherein the first planar portion of the upper surface of the conductive layer is contiguous with the first trench side wall.

22. The semiconductor structure of claim 10 wherein:

the upper surface of the semiconductor substrate has a third planar region that is adjacent to the first trench side wall and that is coplanar with the first planar region; and the first transistor channel region is disposed in the third planar region of the upper surface of the substrate.

23. The semiconductor structure of claim 10 wherein:

the first transistor channel region is disposed in the substrate contiguous with the first edge of the cap portion;

the upper surface of the semiconductor substrate has a third planar region that is adjacent to the second trench side wall and that is coplanar with the second planar region; and further comprising a second transistor channel region disposed in the third planar region of the upper surface of the substrate.

24. The semiconductor structure of claim 13, further comprising:

a second transistor channel disposed in the second planar region of the upper surface of the substrate;

a third insulator disposed on the second transistor channel and contiguous with the outer portion of the first insulator; and wherein the conductor is disposed on the third insulator.

\* \* \* \* \*